United States Patent

Beurrier

[15] 3,675,145

[45] July 4, 1972

[54] AMPLIFIER WITH MATCHED INPUT AND OUTPUT

[72] Inventor: Henry Richard Beurrier, Chester Township, N.J.

[73] Assignee: Bell Telephone Laboratories, Incorporated, Murray Hill, Berkeley Heights, N.J.

[22] Filed: March 22, 1971

[21] Appl. No.: 126,683

[52] U.S. Cl. ............................330/124 R, 330/30 R, 330/20
[51] Int. Cl. ............................H03f 3/68
[58] Field of Search ................330/150, 124 R, 178, 70, 165, 330/30 R, 38 MC

[56] References Cited

UNITED STATES PATENTS

| | | | |
|---|---|---|---|
| 2,762,870 | 9/1956 | Sziklai et al. | 330/30 R |
| 2,941,154 | 6/1960 | Rogers | 330/38 M |

*Primary Examiner*—Nathan Kaufman
*Attorney*—R. J. Guenther and Arthur J. Torsiglieri

[57] ABSTRACT

This application describes an arrangement for matching the output impedance of an amplifier to its load. The amplifier comprises two active stages having mutually inverse output impedances whose respective magnitudes are, preferably, at least an order of magnitude greater than and at least an order of magnitude less than the impedance of the external load circuit to which the amplifier is connected. The lower output impedance stage is connected to a first load impedance through one winding of a two-winding transformer. The higher output impedance stage is connected to ground through the other transformer winding. A second, impedance-matching load is connected in shunt with either one of the two transformer windings. By controlling the relative amplitude and phase of the signals derived from the two stages, the signal current can be coupled to either one or the other of the two load impedances, or to both.

Arrangements for increasing the amplifier gain and obtaining a match at the amplifier input are also described.

15 Claims, 12 Drawing Figures

INVENTOR
H. R. BEURRIER
BY
Lyman Sherman
ATTORNEY

AMPLIFIER WITH MATCHED INPUT AND OUTPUT

This invention relates to impedance-matched amplifiers.

BACKGROUND OF THE INVENTION

It is a very common practice to employ amplifiers whose output impedances are significantly different that the impedances of the circuits to which they are connected. In a communication system, however, large mismatches tend to produce echoes, delay distortion and other deleterious effects which adversely affect system operations and, hence, must be avoided.

It is, accordingly, the broad object of the present invention to match the output impedance of an amplifier to its output load.

The simplest way to match unequal impedances is by means of an impedance-matching transformer. Such an arrangement, however, can only be used when the two impedances to be matched are uniquely known. The output impedance of an amplifier, on the other hand, tends to vary as a function of frequency. Hence, a simple transformer cannot generally be used for this purpose, and, in particular, it cannot be used in association with a wideband amplifier.

It is, therefore, a more specific object of the present invention to match the output impedance of an amplifier to its output load over a wide range of frequencies.

SUMMARY OF THE INVENTION

An amplifier, in accordance with the present invention, utilizes two active stages having mutually inverse output impedances whose respective magnitudes are, preferably, at least an order of magnitude greater than and at least an order of magnitude less than the impedance of the external circuit to which the amplifier is connected. The lower output impedance stage is connected to a first load through one winding of a two-winding transformer. The higher output impedance stage is connected to ground through the other transformer winding. A second, impedance-matching load is connected in shunt with either one of the two transformer windings. By controlling the relative amplitude and phase of the signals derived from the two stages, the signal can be coupled to either one or the other of the two load impedances, or to both.

It is a feature of the invention that each load impedance sees only the other load impedance. Hence, looking back towards the amplifier, each impedance sees a matched source notwithstanding the fact that the output impedances of the two active stages are, in reality, severely mismatched with respect to the load.

Increased gain can be realized by using a plurality of transformers and scaling the relative amplitudes of the stage signals in a prescribed manner. Alternatively, the amplifier gain can be increased by coupling the signal source to the two active stages through a transformer which steps up the voltage and current coupled to the respective stages. A combination of these two gain-enhancing arrangements is also described.

Input circuits, for matching the signal source to the two active stages, are also described.

These and other objects and advantages, the nature of the present invention, and its various features, will appear more fully upon consideration of the various illustrative embodiments now to be described in detail in connection with the accompanying drawings.

DETAILED DESCRIPTION

In the various embodiments now to be described, the same identification numerals are used in the several drawings to identify corresponding components.

Figure 1:
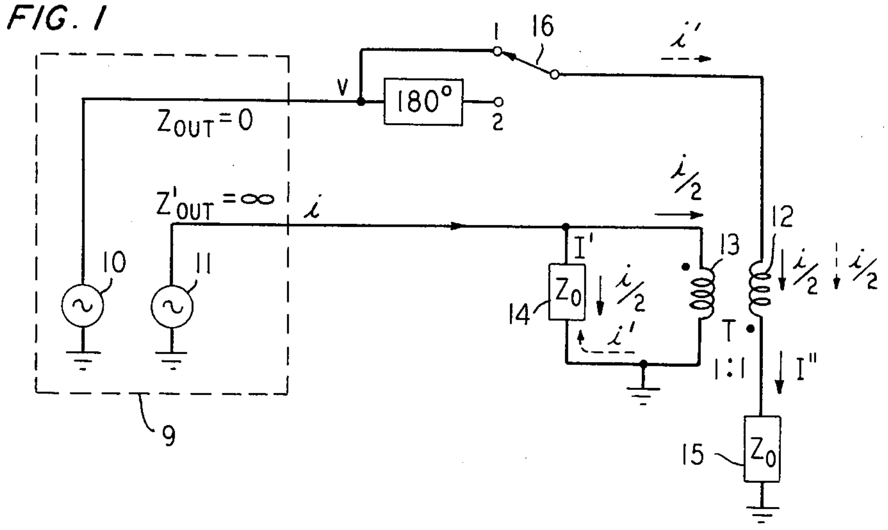
FIG. 1, included for purposes of explanation, shows, in block diagram, a simplified embodiment of the invention.

Referring now to the first drawing, FIG. 1, included for purposes of explanation, shows, in block diagram, a simplified embodiment of the invention, comprising: a signal source 9, whose output includes two coherent signals $v$ and $i$; a two-winding transformer T, having a 1:1 turns ratio; a pair of equal load impedances 14 and 15; and a two-way switch 16. More particularly, signal $v$ is the output voltage of a constant voltage generator 10 which is connected in series with transformer winding 12 and impedance 15 through switch 16. In switch position 1 shown, generator 10 is connected directly to winding 12. In switch position 2, an additional 180° of relative phase shift is introduced for reasons which will be explained in greater detail below. The other signal $i$ is the output current of a constant current generator 11 which is connected in series with transformer winding 13. Load impedance 14 is connected in shunt across winding 13.

In operation, current $i$, flowing into the parallel-connected impedance 14 and winding 13, divides between them in inverse proportion to their respective impedances. The former impedance is $Z_o$. The latter impedance is the impedance that is reflected by virtue of the coupling between transformer windings 12 and 13. Since generator 10 is a constant voltage generator, it has, ideally, zero output impedance (i.e., $Z_{out} = 0$). Hence, the impedance in series with winding 12 is equal to that of load 15, or $Z_o$. Being a 1:1 turns ratio transformer, the impedance reflected in series with winding 13 is, therefore, also $Z_o$. Thus, the incident current $i$ sees two equal, parallel-connected impedances and divides equally between them, with one-half the incident current, $i/2$, flowing through impedance 14 and the other half, $i/2$, flowing through winding 13. The latter current, in turn, induces an equal current $i/2$ in winding 12. The currents due to generator 11 are indicated by the solid arrows.

Simultaneously, voltage $v$ produced by generator 10 causes a current to flow into the series-connected transformer winding 12 and impedance 15. The magnitude, $i'$, of this current is determined by the impedance of this circuit which includes as a component, the impedance reflected in series with winding 12 by virtue of the coupling between windings 12 and 13. Since generator 11 is a constant current generator, it has, ideally, infinite output impedance (i.e., $Z'_{out} = \infty$). Accordingly, the only impedance in series with winding 13 is equal to that of load 14, or $Z_o$, and, hence, the impedance reflected in series with winding 12 is also equal to $Z_o$. The total impedance in series with generator 10 is, therefore, equal to $2Z_o$ and the current $i'$ is given by $$i' = v/2Z_o. \quad (1)$$

An equal current $i'$ is induced in winding 13, and flows through impedance 14 in the opposite sense to the current produced by generator 11. The currents due to generator 10 are indicated in FIG. 1 by the broken arrows.

The total currents I′ and I″ in the two loads 14 and 15, respectively, are then given by $$I' = (i/2) - i' \quad (2)$$

and $$I'' = (i/2) + i' . \quad (3)$$

Substituting from $i'$ from Equation (1), we obtain $$I' = (i/2) - (v/2Z_o) \quad (4)$$

and $$I'' = (i/2) + (v/2Z_o) . \quad (5)$$

In the special case where $$v = iZ_o \quad (6)$$

Equations (4) and (5) reduce to $$I' = 0 \quad (7)$$

and $$I'' = i. \quad (8)$$

Thus, when the two signals are related by the impedance $Z_o$, a current $i$ is coupled to one of the load impedances 15 and none is coupled to the other load impedance 14. The former impedance, therefore, would be the useful load, and the latter, a dummy load.

It is a feature of this circuit that either load, looking back towards source 9, sees only the matching impedance $Z_o$, reflected by the other load. Thus, the amplifier output is matched to load impedance 15 in spite of the fact that the individual generators 10 and 11, comprising source 9, are badly mismatched with respect to the load.

It will be noted that with $I' = 0$, there is no net voltage produced across the parallel-connected winding 12 and impedance 14. Thus, in effect, generator 11 drives a short circuit and, hence, develops no output power and delivers no output power to load 15. All of the output power comes from generator 10. If, on the other hand, switch 16 is switched to position 2, an additional 180° is introduced in the output current $i'$, reversing its sense of direction in impedances 14 and 15 such that the currents $I'$ and $I''$ are now given by $$I' = i \quad (9)$$

and $$I'' = 0. \quad (10)$$

Thus, in this second case, the net current from generator 10 is zero and, in effect, generator 10 drives an open circuit. All of the output power, delivered in this instance to load impedance 14, comes, therefore, from generator 11. It is apparent, from the above, that power can be switched back and forth between loads 14 and 15 by switching switch 16 back and forth between its two positions. This will be referred to again in greater detail hereinbelow.

Figure 1A:
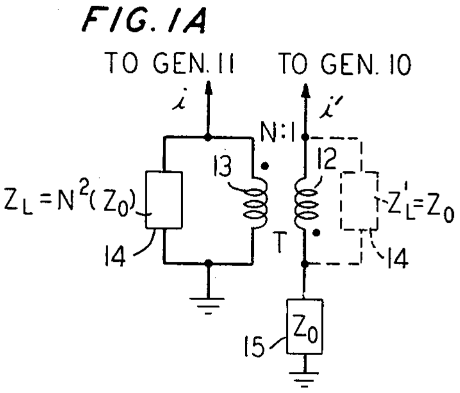
FIGS. 1A and 1B show several modifications of the embodiment of FIG. 1.

In the above-described illustrative embodiment, transformer T is characterized as a 1:1 turns ratio transformer and load 14 is connected across transformer winding 13. More generally, however, a transformer having any arbitrary turns ratio N:1 can be used, and load 14 can be connected in shunt with all or a portion of either winding 12 or 13. For example, if transformer T has a turns ratio N:1, as shown in FIG. 1A, the currents $i$ and $i'$ must be proportioned such that $$Ni = i', \quad (11)$$

and the impedance $Z_L$ of load 14 must be proportioned such that $$Z_L = (N^2)Z_o. \quad (12)$$

Alternatively, if load 14 is connected in shunt with winding 12 (shown dotted in FIG. 1A) instead of winding 13, its impedance $Z'_L$ is made equal to $Z_o$.

Figure 1B:
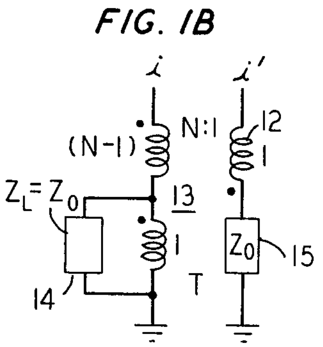

A second alternative is illustrated in FIG. 1B. Assuming that transformer T has a turns ratio N:1, where N is greater than 1, a load impedance 14 equal to $Z_o$ can be connected across a portion of winding 13 where the turns ratio between winding 12 and said portion is 1:1.

It will also be noted that in the illustrative embodiment of FIG. 1, generators 10 and 11 are depicted as independent signal sources. However, it is apparent from the explanation given hereinabove, that they must be coherent generators whose outputs are related in a prescribed manner. In the embodiment of an amplifier now to be described in connection with FIG. 2, generators 10 and 11 comprise two active stages 20 and 21 which are driven by a common signal source 22 in the manner described in my copending application, Ser. No. 113,200, filed Feb. 8, 1971, and assigned to applicant's assignee. As described therein, stages 20 and 21, each of which can include one or more active elements, have mutually inverse input and output impedances, where the term "mutually inverse input impedances," as used herein, means that relative to some reference impedance, the input impedance of one stage is much larger (preferably an order of magnitude or more greater) than the reference impedance, while the input impedance of the other stage is much smaller (preferably at least an order of magnitude less) than the chosen reference impedance. Similarly, the term "mutually inverse output impedances" means that the output impedance of one of the stages is much greater than some given reference impedance, while the output impedance of the other stage is much smaller than the given reference impedance. In the illustrative embodiment of FIG. 2, the stage input impedances $Z_{in}$ and $Z'_{in}$ are measured relative to the output impedance $Z_s$ of source 22, while the stage output impedances $Z_{out}$ and $Z'_{out}$ are measured relative to the impedance of the output load $Z_o$. For purposes of explanation, source 22 and the output load impedance are assumed to have the same impedance $Z_o$. Thus, the input and output impedances of stages 20 and 21 are such that $$Z_{in} > Z_o > Z'_{in} \quad (13)$$

and $$Z'_{out} > Z_o > Z_{out}. \quad (14)$$

Alternatively, the same stage can have both the higher input impedance as well as the higher output impedance, as will be illustrated in greater detail hereinbelow.

Source 22 is coupled directly to the higher input impedance stage 20, and is coupled to the lower input impedance stage 21 through a series impedance 23 equal to the source impedance $Z_o$. The stage outputs are connected in the manner described hereinabove in connection with FIG. 1. That is, stage 21, corresponding to the constant current generator 11, is connected to the parallel-connected load impedance 14 and transformer winding 13, and stage 20, corresponding to the constant voltage generator 10, is connected through a modulator 26 to the series-connected transformer winding 12 and load impedance 15. The latter, in the embodiment of FIG. 2, comprises a transmission line 28 of characteristic impedance $Z_o$, suitably terminated at its output end.

In operation, signal source 22 causes an input signal to be applied to stages 20 and 21. Since the input impedance of stage 20 is much larger than the source impedance (i.e., $Z_{in} = \infty$), and the input impedance of stage 21 is much less than the source impedance (i.e., $Z'_{in} = 0$), the signal source current is determined by the source impedance and the series impedance 23. Assuming an open-circuit source voltage $2v$, the current $i$ into stage 21 is $$i = 2v/2Z_o = v/Z_o, \quad (15)$$

and the voltage $V$ applied to stage 20 is $$V = iZ_o = V. \quad (16)$$

The outputs from stages 20 and 21 are $vg$ and $iG$, respectively, where $g$ and G are the stage gains.

From Equations (4) and (5) the current $I'$ in impedance 14 and the current $I''$ in impedance 15 are then $$I' = (iG/2) - (vg/2Z_o) \quad (17)$$

and $$I'' = (iG/2) + (vg/2Z_o) \quad (18)$$

Substituting $iZ_o$ for $v$ from Equation (16), we derive $$I' = (iG/2) + (ig/2) = (i/2)(G-g), \quad (19)$$

and $$I'' = iG/2 + ig/2 = i/2\,(G+g) \quad (20)$$

By making the stage gains equal (i.e., $g = G$), we obtain the preferred condition that all of the output signal $$I'' = iG \quad (21)$$

is coupled to the output load 15, and that no signal current is coupled to the dummy load 14 since $$I' = 0 \quad (22)$$

As indicated hereinabove, all of the output current can be shifted between loads by the introduction of a 180°-differential phase shift in one of the stage output circuits. This provides a convenient way of producing a pulse code modulated (PCM) signal. For example, a modulator 26, included in series with stage 20, is adapted to introduce zero relative phase shift for one binary state of an applied binary-encoded information signal, and an additional 180° of phase shift for the other binary state of the applied information signal. Thus, for one binary state (i.e., a mark), all of the signal current is coupled to the load 15, producing an output signal in transmission line 28, whereas for the other binary state (i.e., a space), all of the signal current is coupled to the dummy load 14, producing no output signal in transmission line 28.

At microwave frequencies, modulator 26 can be any one of the well-known ferrite phase shifters whose phase shift is controlled by varying the magnetic bias applied to the ferrite (see, for example, U.S. Pat. No. 3,290,622). At the lower frequencies, a modulator such as is illustrated in FIG. 2A can be used. In this illustrative embodiment, the input signal is coupled to a primary winding 31 of a three winding transformer 30. The two secondary windings 32 and 33 are wound in opposite relative senses such that the signals produced by these two windings are 180° out of phase. To select one of these two signals, the secondary windings are connected directly together at one end, and connected together at their other ends through oppositely poled diodes 34 and 35.

In the absence of an information signal, both diodes are nonconducting so that both secondary windings are open-circuited, producing no output signal. The application of binary signals of one polarity switches one of the diodes to its high conductivity state and, thereby, closes the circuit for one of the secondary windings, producing an output signal of one polarity. The application of a binary signal of the opposite polarity causes the other diode to switch to its hIgh conductivity state, thereby closing the circuit for the oppositely wound secondary winding to produce an output signal of the opposite polarity.

Figure 2:
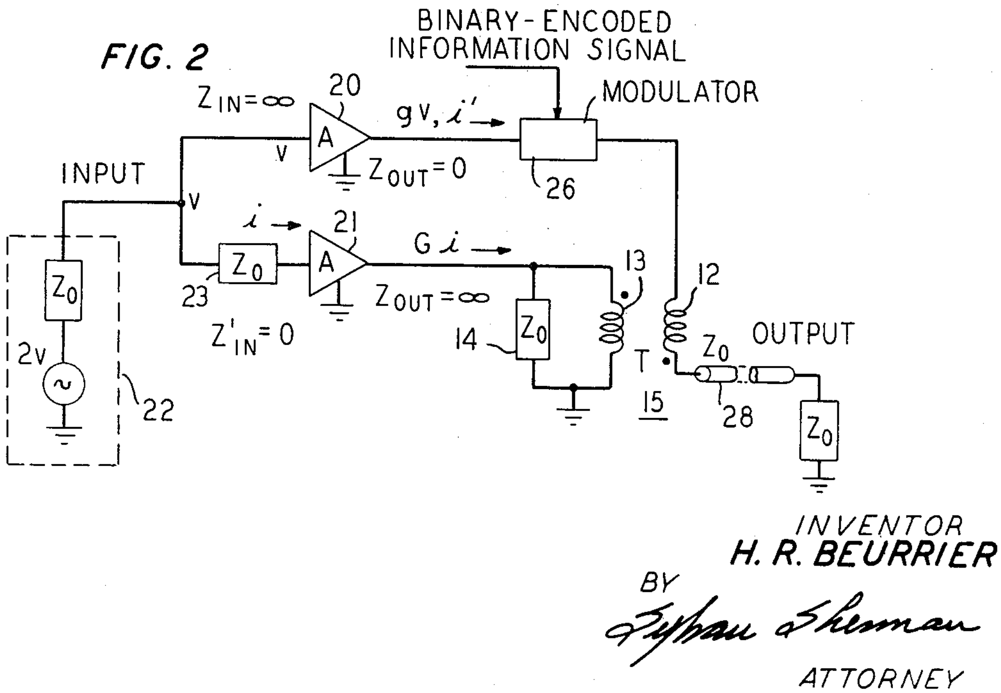
FIG. 2 shows a first embodiment of an amplifier in accordance with the invention.
Figure 2A:
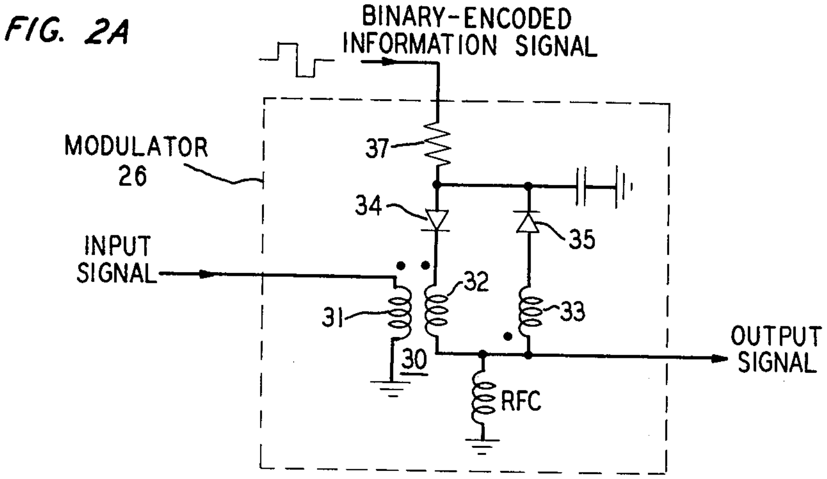
FIG. 2A, included for purposes of illustration, shows a modulator for use in connection with the present invention.

It should be noted that while modulator 26 is located in the output circuit of one of the stages in FIG. 2, it can, alternatively, be located in one of the stage input circuits.

FIGS. 3 through 7, now to be described, illustrate various active stages that can be employed to practice the invention. To simplify the drawings, the conventional direct current biasing circuits have been omitted.

Figure 3:
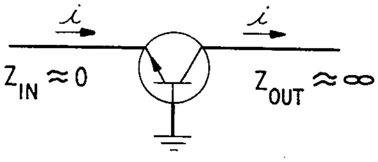
FIGS. 3–7 illustrate various active stages that can be used to practice the present invention.
Figure 4:
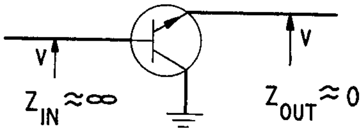

As is known, a transistor, connected in the common base configuration, as illustrated in FIG. 3, transforms a current $i$, with unity gain, from a low to a high impedance. To within a good approximation, the input impedance $Z_{in}$ of a common base transistor is zero, and its output impedance $Z_{out}$ is infinite. Conversely, a transistor connected in a common collector configuration, as illustrated in FIG. 4, transforms a voltage $v$, with unity gain, from a high impedance to a low impedance. Thus, to within an equally good approximation, the input impedance $Z_{in}$ of a common collector transistor is infinite, and its output impedance $Z_{out}$ is zero.

Figure 5:
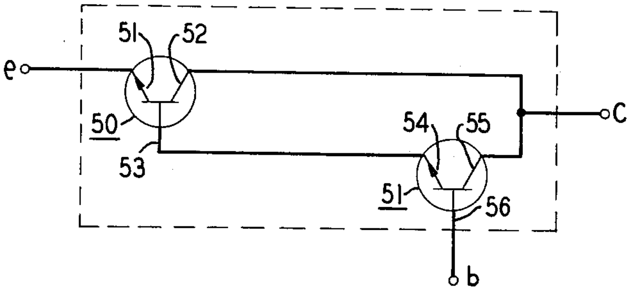

It will be recognized, however, that in a practical case the input and output impedances, if small, will be greater than zero and, if large, will be less than infinite. Nevertheless, relative to a specific source impedance $Z_o$ and a specific load impedance $Z'_o$, they can, for all practical purposes, be considered to be zero or infinite. If, however, a better approximation is required, a Darlington pair, as illustrated in FIG. 5, can be used. In this arrangement, the base 53 of a first transistor 50 is connected to the emitter 54 of a second transistor 51. The two collectors 52 and 55 are connected together to form the collector $c$ for the pair. The emitter 51 of transistor 50 is the pair emitter $e$, while the base 56 of transistor 51 is the pair base $b$.

The gain factor $\alpha$ for such a pair is given by $$\alpha = \alpha_1 + (1 - \alpha_1)\,\alpha_2\,, \quad (23)$$

where $\alpha_1$ and $\alpha_2$ are the gain factors for transistors 50 and 51, respectively. If, for example, $\alpha_1$ and $\alpha_2$ are both equal to 0.95, the $\alpha$ for the Darlington pair is then equal to 0.9975. Correspondingly, the input and output impedances for a Darlington pair more nearly approach the ideal values.

It will be noted that there is an impedance transformation between input and output for each of the transistor configurations illustrated in FIGS. 3 and 4. However, as was noted hereinabove, the same stage can have both the lower input and output impedances, while the other stage has the higher input and output impedances. Active stages of these sorts are illustrated in FIGS. 6 and 7.

Figure 6:
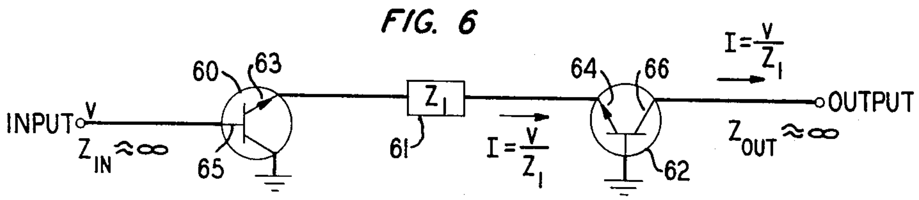

In the embodiment of FIG. 6, a first transistor 60, connected in the common collector configuration, is coupled to a second transistor 62, connected in the common base configuration, through a series impedance 61. In operation, a voltage $v$ applied to the base 65 of transistor 60 induces a voltage $v$ at the emitter 63 which is impressed across impedance 61. This, in turn, causes a current $v/Z_1$ to flow into the emitter 64 of transistor 62, producing an output current $I = v/Z_1$ in collector 66.

Figure 7:
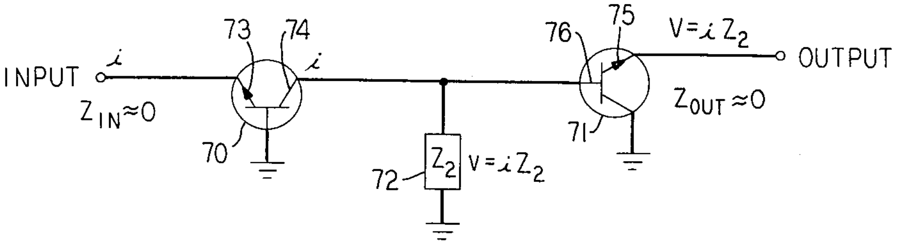

In the embodiment of FIG. 7, a first transistor 70, connected in the common base configuration, is coupled to a second transistor 71 by means of a shunt impedance 72. In operation, a current $i$ applied to the emitter 73 of transister 70 causes a current $i$ in the collector 74. This current, flowing through impedance 72 produces a voltage, $v = iZ_2$ at the base 76 of transistor 71. This, in turn, produces an equal output voltage $V = iZ_2$ at the emitter 75 of transistor 71.

It will be noted that in each of these circuits the input impedance $Z_{in}$ and the impedance $Z_{out}$ are of the same order of magnitude. Ideally, the input and output impedances for the circuit shown in FIG. 6 are infinite, whereas in the embodiment shown in FIG. 7, these impedances are zero.

In the illustrative embodiment of FIG. 2 the active stages could be assumed to be of the type illustrated in FIGS. 3 and 4 in that the stage with the higher input impedance had the lower output impedance, and vice versa. If, however, active stages of the type illustrated in FIGS. 6 and 7 are used, the stage having the larger input impedance will also have the larger output impedance, and the stage with the lower input impedance will have the lower output impedance. In this latter case, it would be necessary to relocate impedance 23 since stage 20, which has the lower output impedance, would also now have the lower input impedance and, as indicated hereinabove, impedance 23 is located in series with the lower input impedance stage. In all other respects the operation of the amplifier is the same.

If active stages of the type shown in FIGS. 3 and 4 are used, the overall amplifier gain is unity, since the stage gains $g$ and $G$ are unity. The various embodiments now to be described illustrate various ways in which the overall gain can be increased while still preserving the amplifiers output match.

Figure 8:
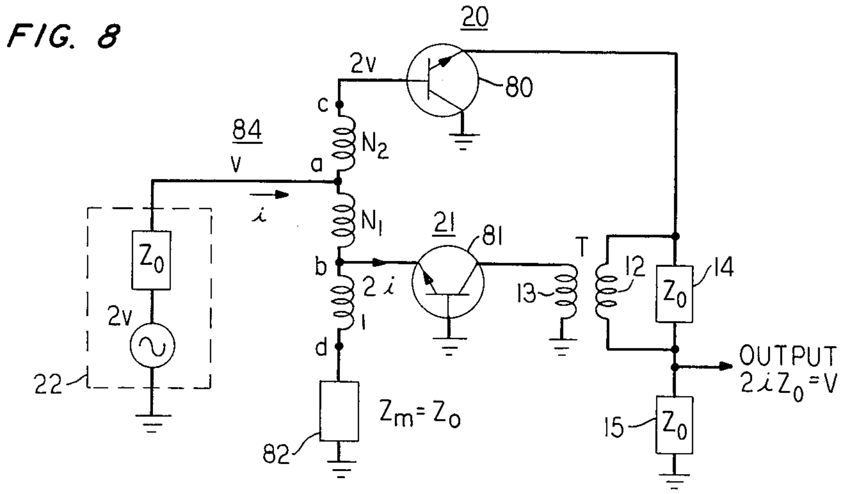
FIG. 8 shows the embodiment of FIG. 2 modified at the input end to produce greater overall amplifier gain.

FIG. 8 shows a first modification of the basic circuit wherein signal source 22 is coupled to stages 20 and 21 by means of an autotransformer 84 whose turns ratios $1{:}N_1{:}N_1$ are adjusted to produce a voltage step-up at the input to stage 20 and a current step-up at the input of stage 21. Accordingly, signal source 22 is connected at a tap $a$ along transformer 84. Stage 20, comprising a transistor 80 connected in the common collector configuration, is connected at transformer end $c$. For purposes of illustration, a 1:2 step-up is indicated, such that the input voltage to transistor 80 is 2v, instead of $v$ as in the embodiment of FIG. 2.

Stage 21, comprising a transistor 81 connected in the common base configuration, is connected at a tap $b$ on transformer 84 to produce a 1:2 current step-up such that the input current to transistor 81 is $2i$, or twice the current coupled to amplifier 21 in FIG. 2. The other end $d$ of transformer 84 is connected to ground through a matching impedance 82 whose impedance $Z_m$, for this particular illustrative embodiment, is equal to the source impedance $Z_o$. Alternatively, an impedance $Z'_m$, equal to $Z_o/4$, can be placed between tap $b$ and transistor 81, as shown in my above-identified application, and transformer end $d$ grounded. In this latter case, end $d$ would be grounded and the turns on winding $N_2$ would then be adjusted so that $N_2 = 2(N_2 + 1)$, in order to maintain $2v$ input to transistor 80.

The stage outputs are connected to transformer T in the manner described hereinabove. That is, stage 20 is connected to one end of winding 12, and stage 21 is connected to one end of winding 13. The other end of the latter is grounded, whereas the other end of winding 12 is connected to load impedance 15. The dummy impedance 14, however, is shown connected in parallel with winding 12 instead of in parallel with winding 13, as in FIG. 2. This change is merely intended to indicate that the dummy load, as noted hereinabove, can be connected in parallel with either of the transformer windings without in any way modifying the operation of the amplifier. However, the dummy load is advantageously placed across winding 13, thus permitting one end thereof to be grounded.

In all other respects, the amplifier shown in FIG. 8 operates in the manner described above, with the exception that the output voltage $V$ is now $2iZ_o$, for an overall gain of 6 db. More generally, the gain can be increased by a factor $M$ by suitably designing the step-up ratio of transformer 84. For example, in the illustrative embodiment of FIG. 8, a gain factor of $M = 2$ is obtained. For this case, the turns ratios for transformer 84 are $1:N_1:N_2 = 1:1:1$. In general, for an arbitrary gain ratio $M$, the transformer turns ratios are given by $$1:(M-1):(M-1)^2 \quad (24)$$

and the impedance $Z_M$ of matching impedance 82 is given by $$Z_M = Z_s/(M-1)^2 \,, \quad (25)$$

where $Z_s$ is the source impedance.

Figure 9:
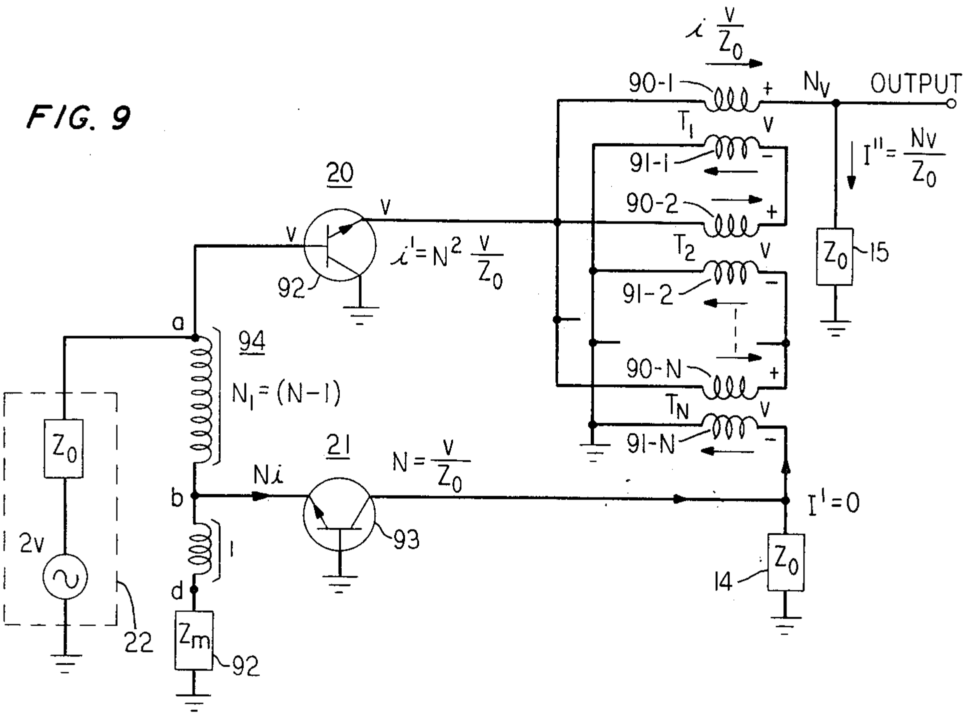
FIG. 9 shows an alternative arrangement, using a plurality of transformers, to obtain increased amplifier gain.

FIG. 9 shows an alternate arrangement for increasing the amplifier gain using a plurality of transformers in the output portion of the amplifier. In this embodiment, the output of stage 20, which comprises a transistor 92 connected in the common collector configuration, is connected to a plurality of N identical, 1:1 turns ratio transformers $T_1, T_2 \ldots T_N$. Arbitrarily designating one winding 90–1, 90–2, . . . 90–N of each as the primary winding, and the other winding 91–1, 91–2, . . . 91–N of each transformer as the secondary winding, the emitter of transistor 92 is connected to one end of each transformer primary winding. The adjacent end of each secondary winding is grounded. The other end of primary winding 90–1 of the first transformer $T_1$ is connected to load impedance 15, while the other end of secondary winding 91–N of the last transformer $T_N$ is connected to dummy impedance 14. The latter is also connected to the output of stage 21, which comprises a transistor 93 connected in the common base configuration. The remaining transformer windings are connected such that the secondary winding of each is connected to the primary winding of the next adjacent transformer. Thus, secondary winding 91–1 is connected to primary winding 90–2, and secondary winding 91–2 would be connected to the primary winding of the next transformer $T_3$ (not shown), etc.

It will be noted that connected in the manner described, the transformers serve as baluns whose inputs are connected in parallel, and whose outputs are connected in series. Thus, the output voltage $v$ from stage 20 is applied to each of the transformers, producing an output voltage $Nv$ across the series-connected output ends of the transformers. This voltage is impressed across the output load impedance 15, causing a current $$I'' = Nv/Z_o \quad (26)$$

to flow therethrough. This current, flowing through winding 90–1 of transformer $T_1$, induces an equal current in secondary winding 91–1. Since the latter winding is in series with primary winding 90–2 of transformer $T_2$, the same current flows through winding 90–2 inducing an equal current in secondary winding 91-2. In this manner, the same load current flows through each of the windings in the directions indicated by the arrows in FIG. 9. The total output current $i'$ from transistor 92 is the sum of the $N$ primary winding currents, or $$i' = N^2 (v/Z_o) \,. \quad (27)$$

The current $N(v/Z_o)$ into the secondary winding 91–$N$ of the last transformer $T_N$, is supplied by stage 21. Thus, the amplifier drive circuit is designed to provide an input voltage of $v$ to stage 20 and an input current $Ni$ to amplifier 21, where, as above, $v = iZ_o$. This can readily be obtained by an arrangement similar to that used in connection with the embodiment of FIG. 8. As illustrated in FIG. 9, the input circuit comprises an autotransformer 94, an end of which is connected to signal source 22, and the other end of which is connected to a matching termination 92 whose impedance $Z_M$ is equal to $Z_s/(N-1)^2$.

A stepped-up input current $Ni$ is obtained for stage 21 by tapping down on transformer 94. Thus, the emitter of transistor 93 is connected to a tap $b$ on transformer 94 to obtain a $1:N$ current step-up. Since the input voltage to stage 20 requires no step-up, the base of transistor 92 is connected to the junction $a$ of transformer 94 and source 22.

The arrangements for obtaining gain described in connection with FIGS. 8 and 9 can be combined. In the embodiments of FIG. 8, the gain was increased by a factor $M$ by proportionately increasing the input current and input voltage by a factor $M$. In the embodiment of FIG. 9, the gain was increased by a factor of $N$ by an arrangement of output transformers which, in turn, required only that the input current to stage 21 be increased by a factor $N$. Thus, an overall gain factor of $NM$ is obtained by increasing the input signals such that the signal voltage applied to stage 20 is increased by a factor $M$ and the signal current applied to stage 21 is increased by a factor $NM$.

Thus, it will be recognized that the above-described arrangements are illustrative of but a small number of the many possible specific embodiments which can represent applications of the principles of the invention. Numerous and varied other arrangements can readily be devised in accordance with these principles by those skilled in the art without departing from the spirit and scope of the invention.

What is claimed is:

1. An amplifier for coupling between a signal source and an output load comprising:

first and second active stages;

the first of said stages having an output impedance that is greater than the load impedance, while the second of said stages has an output impedance that is less than the load impedance;

a two-winding transformer;

means for coupling the output of said first stage in series with one transformer winding;

means for coupling the output of said second stage in series with the other transformer winding and a first load;

a second load connected in shunt with at least a portion of one of said windings; and means for coupling said source to the input of both of said stages.

2. The amplifier in accordance with claim 1 wherein said transformer has a 1:1 turns ratio; and wherein the output current $i$ from said first stage, and the output voltage $v$ from said second stage are related by $$v = iZ_o \,,$$

where $Z_o$ is the impedance of said first load.

3. The amplifier in accordance with claim 1 wherein the turns ratio of said one transformer winding to said other transformer winding is $N$:1;

and wherein the output current $i$ from said first stage and the output current $i'$ from said second stage are related by $i' = Ni$.

4. The amplifier according to claim 3 wherein said second load is connected in shunt with said one winding;

and wherein the impedance $Z_L$ of said second load is given by $Z_L = N^2 Z_o$, where $Z_o$ is the impedance of said first load.

5. The amplifier according to claim 3 wherein said second load is connected in shunt with said other winding; and wherein the impedance $Z_L$ of said second load is equal to the impedance of said first load.

6. The amplifier according to claim 1 including means for changing the phase of the output from one of said stages by 180°.

7. The amplifier according to claim 6 wherein said phase is changed in response to a binary-encoded information signal.

8. The amplifier in accordance with claim 1 wherein one of said stages has an input impedance that is greater than said source impedance, while the other of said stages has an input impedance that is less than said source impedance.

9. The amplifier according to claim 8 wherein said source is coupled directly to said one stage;

and wherein said source is coupled to said other stage through a series impedance equal to said source impedance.

10. The amplifier according to claim 8 wherein said source is coupled to said stages by means of a transformer;

and wherein said transformer produces a voltage step-up to said one stage and an equal current step-up to said other stage.

11. The amplifier according to claim 8 wherein said source is coupled to said stages by means of an autotransformer; and wherein:

one terminal of said source is connected to a tap along said transformer;

said one stage is coupled to one end of said transformer to produce a voltage step-up, and a matching impedance connects the other end of said transformer to the other terminal of said source;

and said other stage is connected to a tap along said transformer such that the current step-up to said other stage is equal to the voltage step-up to said one stage.

12. The amplifier in accordance with claim 11 where said current step-up factor is $M$;

wherein the impedance $Z_m$ of said matching impedance is given by $$Z_m = Z_s/(M-1)^2,$$

where $Z_s$ is said source impedance.

13. The amplifier in accordance with claim 1 wherein said first stage is a transistor connected in a common collector configuration;

and wherein the second stage is a transistor connected in a common base configuration.

14. An amplifier for coupling between a signal source and an output load comprising:

first and second active stages;

the first of said stages having an output impedance that is less than said load impedance, while the second of said stages has an output impedance that is greater than said load impedance;

a plurality of $N$ two-winding, 1:1 turns ratio transformers;

means for coupling the output of said first stage to one end of the primary winding of each of said transformers;

means for grounding the adjacent end of the secondary winding of each of said transformers;

means for connecting the other end of the primary winding of the first of said transformers to said output load;

means for connecting the other end of the secondary winding of the last of said transformers to the output of said second stage;

means for connecting the other end of the secondary winding of each of said transformers to the other end of the primary winding of a different one of said transformers;

an impedance equal to said load connected across the output of said second stage;

and means for coupling said source to each of said stages.

15. The amplifier according to claim 10 wherein the output voltage $v$ from said first stage and the output current $i$ from said second stage are related by $$v = iZ_o/N,$$

where $Z_o$ is the impedance of said load.

* * * * *